(12) United States Patent
Strähle et al.

(10) Patent No.: US 6,662,859 B2
(45) Date of Patent: Dec. 16, 2003

(54) COOLER FOR POWER ELECTRONICS

(75) Inventors: Roland Strähle, Unterensingen (DE); Dominik Zurek, Korb (DE); Martin Mann, Filderstadt (DE)

(73) Assignee: Modine Manufacturing Company, Racine, WI (US)

( * ) Notice: Subject to any disclaimer, the term of this patent is extended or adjusted under 35 U.S.C. 154(b) by 0 days.

(21) Appl. No.: 10/306,545

(22) Filed: Nov. 27, 2002

(65) Prior Publication Data

US 2003/0121650 A1 Jul. 3, 2003

(30) Foreign Application Priority Data

Nov. 28, 2001 (DE) .......................................... 101 58 387

(51) Int. Cl.[7] ................................................ H05K 7/20
(52) U.S. Cl. ................................. 165/104.13; 165/80.4; 165/104.3; 361/689; 361/700
(58) Field of Search ....................... 165/104.13, 104.21, 165/104.33, 185, 168, 80.4; 361/689, 704, 700

(56) References Cited

U.S. PATENT DOCUMENTS

| | | | | |
|---|---|---|---|---|
| 3,417,814 A | * | 12/1968 | Oktay ..................... | 165/104.13 |
| 3,512,582 A | * | 5/1970 | Chu et al. ............... | 165/104.27 |
| 4,009,417 A | * | 2/1977 | Waldon et al. .................. | 361/38 |
| 4,704,658 A | * | 11/1987 | Yokouchi et al. ........... | 361/698 |
| 4,949,164 A | * | 8/1990 | Ohashi et al. .............. | 257/715 |
| 5,099,908 A | * | 3/1992 | Taraci et al. ................ | 165/272 |
| 6,139,361 A | * | 10/2000 | Przilas et al. ................ | 439/559 |
| 2002/0124997 A1 | | 9/2002 | Blome | |

FOREIGN PATENT DOCUMENTS

| | | | | |
|---|---|---|---|---|
| DE | 19826733 | | 12/1999 | |
| SU | 1686295 A | * | 10/1991 | .................. 165/68 |

* cited by examiner

Primary Examiner—Allen Flanigan
(74) Attorney, Agent, or Firm—Wood, Phillips, Katz, Clark & Mortimer

(57) ABSTRACT

A cooler for an electrical component, including a pressure-tight vessel enclosing the electrical component and including a support plate above the electrical component, a bath of electrically insulating and evaporating liquid surrounding the electrical component within the vessel, a flow channel for cooling liquid on the support plate, and a heat exchange element. The heat exchange element includes a serpentine plate having generally horizontally extending and aligned flanks alternately connected along horizontally extending upper and lower edges, with the lower edges being connected by connectors spaced along the horizontally extending edges and the upper edges being connected by horizontally extending crests secured to the flow channel for heat conduction therebetween. The flow channel may define a U-shaped path with two channel legs connected at one end, with a cooling liquid inlet connected to one of the channel legs and a cooling liquid outlet connected to the other of the channel legs. The connectors connecting the lower edges of the flanks are defined between cutouts extending minimally into the flanks, and no more than ¼ of the height of the flanks. The flanks define surfaces sloped no more than about 20° from vertical.

23 Claims, 5 Drawing Sheets

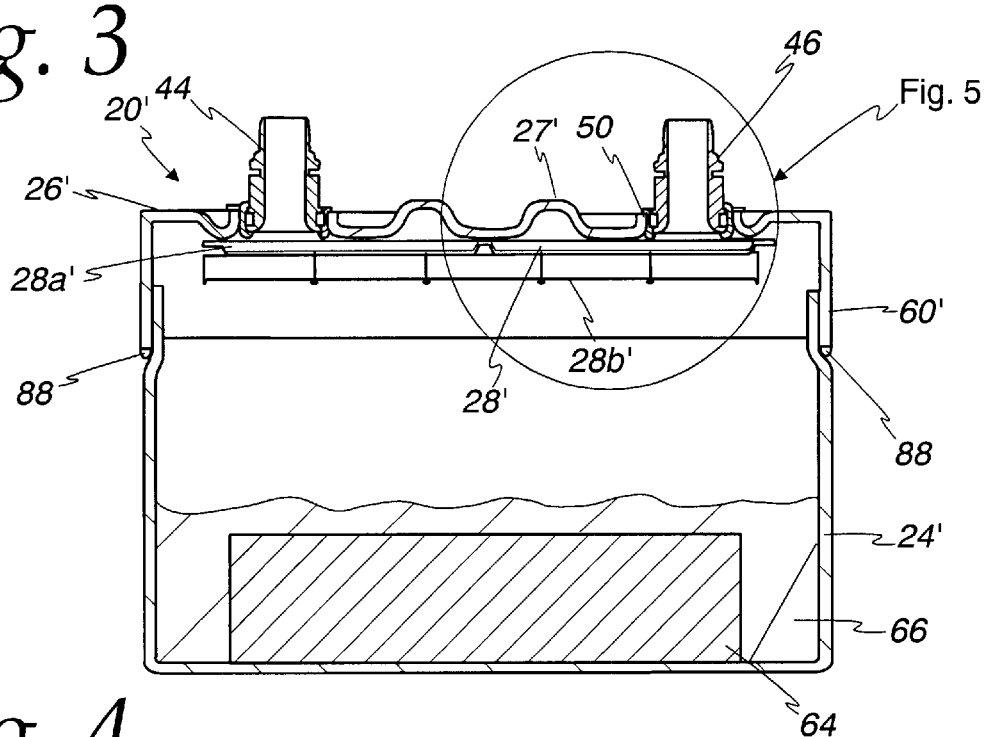
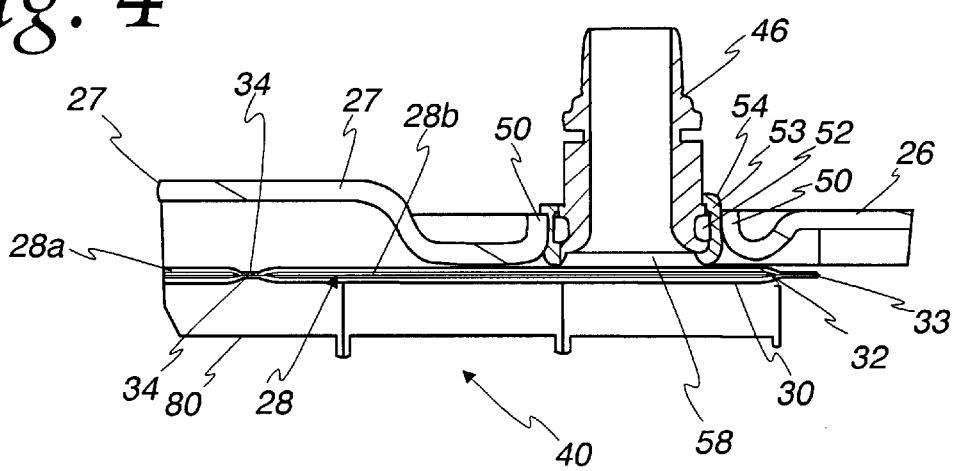
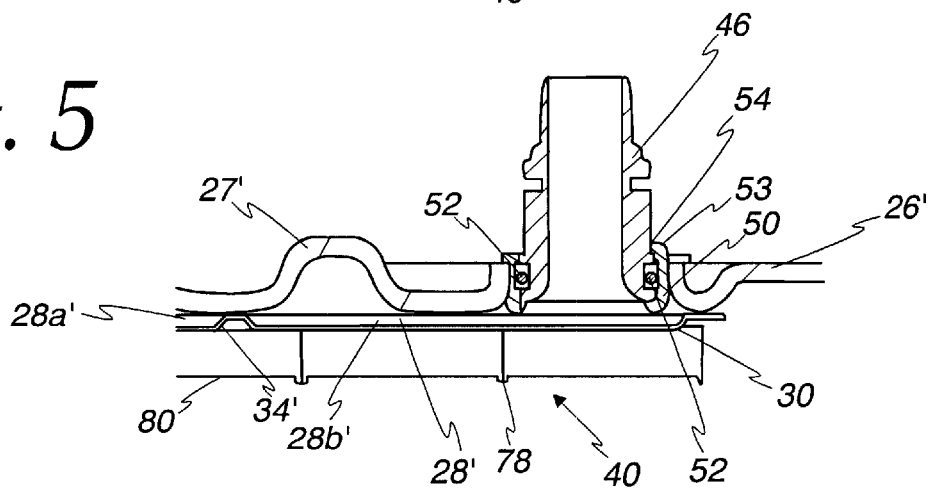

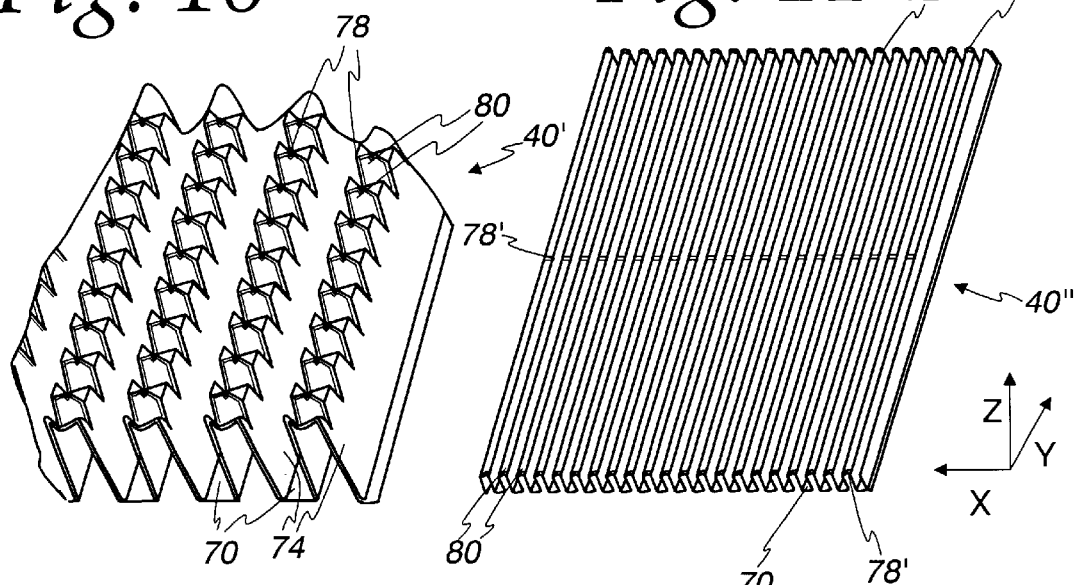
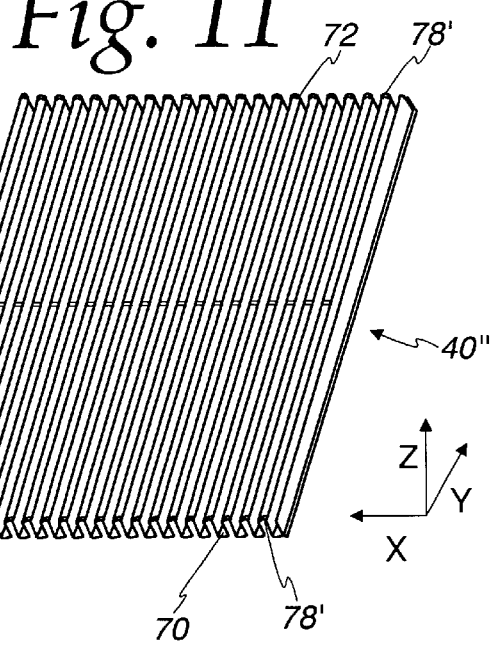
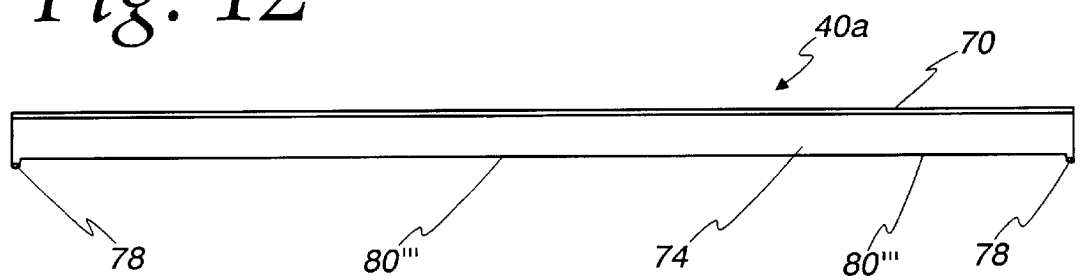
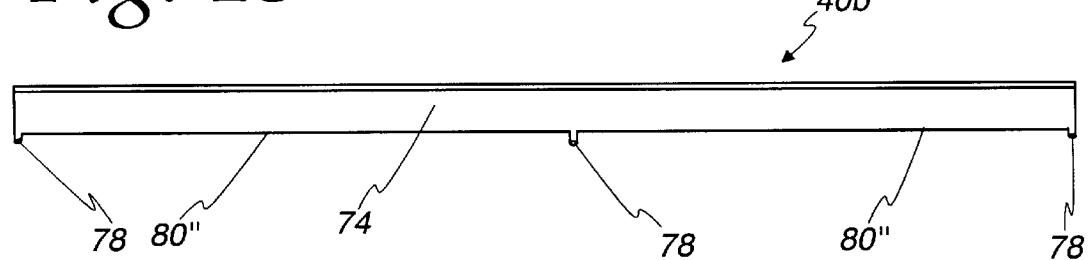
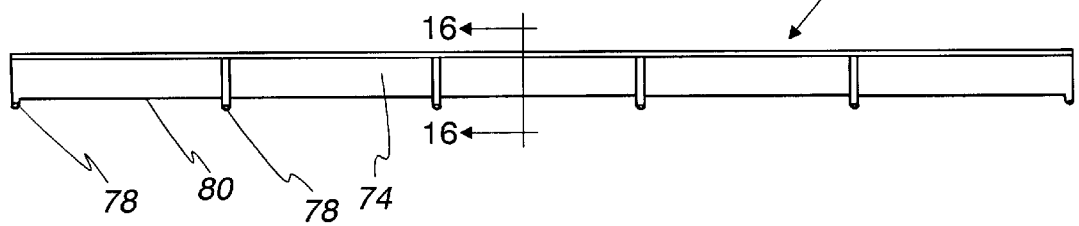

US 6,662,859 B2

COOLER FOR POWER ELECTRONICS

BACKGROUND OF THE INVENTION

The present invention is directed toward heat exchange, and particularly toward a heat exchanger for cooling of power electronics.

Electronic components, and particularly power electronics are known to generate relatively large amounts of heat, which heat if not properly dissipated can damage the electronic component. However, provision of simple, inexpensive and easy to manufacture heat exchangers for such purposes are not readily available.

The present invention is directed toward overcoming one or more of the problems set forth above.

SUMMARY OF THE INVENTION

In one aspect of the present invention, a cooler for an electrical component is provided, including a pressure-tight vessel enclosing the electrical component and including a support plate above the electrical component, a bath of electrically insulating and evaporating liquid surrounding the electrical component within the vessel, a flow channel for cooling liquid on the support plate, and a heat exchange element. The heat exchange element includes a serpentine plate having generally horizontally extending and aligned flanks alternately connected along horizontally extending upper and lower edges, with the lower edges being connected by connectors spaced along the horizontally extending edges and the upper edges being connected by horizontally extending crests secured to the flow channel for heat conduction therebetween.

In one form of this aspect of the invention, a first shell is secured beneath the support plate, where the first shell defines a bottom surface of the flow channel. In a further form, a second shell may be provided between the support plate and the first shell with the second shell defining an upper surface of the flow channel.

In another form of this aspect of the invention, the heat exchange element crests are connected to the first shell in heat-conducting fashion.

In yet another form of this aspect of the invention, the flow channel defines a U-shaped path with two channel legs connected at one end, with a cooling liquid inlet connected to one of the channel legs and a cooling liquid outlet connected to the other of the channel legs.

In still another form of this aspect of the invention, the support plate is the cover of the pressure-tight vessel. In a further form, the vessel cover includes a surrounding downwardly extending flange forming part of the side walls of the pressure-tight vessel.

In another form, stiffening embossments are provided on the support plate.

In still another form, the connectors connecting the lower edges of the flanks are defined between cutouts extending minimally into the flanks. In a further form, the cutouts extend into the flanks no more than ¼ of the height H of the flanks.

In still other forms, the connectors may extend horizontally along the flanks substantially no longer than required to provide structural integrity to the heat exchange element when secured to the flow channel, the horizontally extending crests connecting the upper edges of the flanks may extend substantially the entire length of the flanks, and/or the flanks may define surfaces sloped no more than about 20° from vertical.

In another aspect of the present invention, an evaporative heat exchanger is provided, including a pressure-tight vessel enclosing a heat-generating component in a bath of surrounding evaporating liquid. The vessel includes a support plate above the heat-generating component, and a flow channel for cooling liquid is provided on the support plate. A heat exchange element includes a generally horizontally extending serpentine plate having crests and troughs alternately connecting flanks. The crests are secured to the flow channel for heat conduction therebetween and the troughs include spaced apart connectors between the flanks, where the space between the connectors permits evaporated cooling liquid to pass.

In one form of the present invention, the heat exchange element is formed of a plate having cutouts therein and bent into a substantially serpentine shape with the flanks between the crests and the troughs, the cutouts being in the troughs.

Other forms of the invention such as described with the first described aspect of the invention may also be used with this second aspect of the invention.

BRIEF DESCRIPTION OF THE DRAWINGS

FIG. 3 is a cross-sectional view of a second embodiment of the present invention as incorporated with a pressure-tight vessel and heat generating component;

FIG. 4 is a view of detail Z from FIG. 2;

FIG. 5 is a view of detail Y from FIG. 3;

FIG. 10 is a perspective partial view of fluted heat exchange element;

FIG. 11 is a perspective view of the fluted heat exchange element of FIG. 10;

FIGS. 12 to 14 are side views of alternate heat exchange elements according to the present invention;

DETAILED DESCRIPTION OF THE INVENTION

Figure 1:
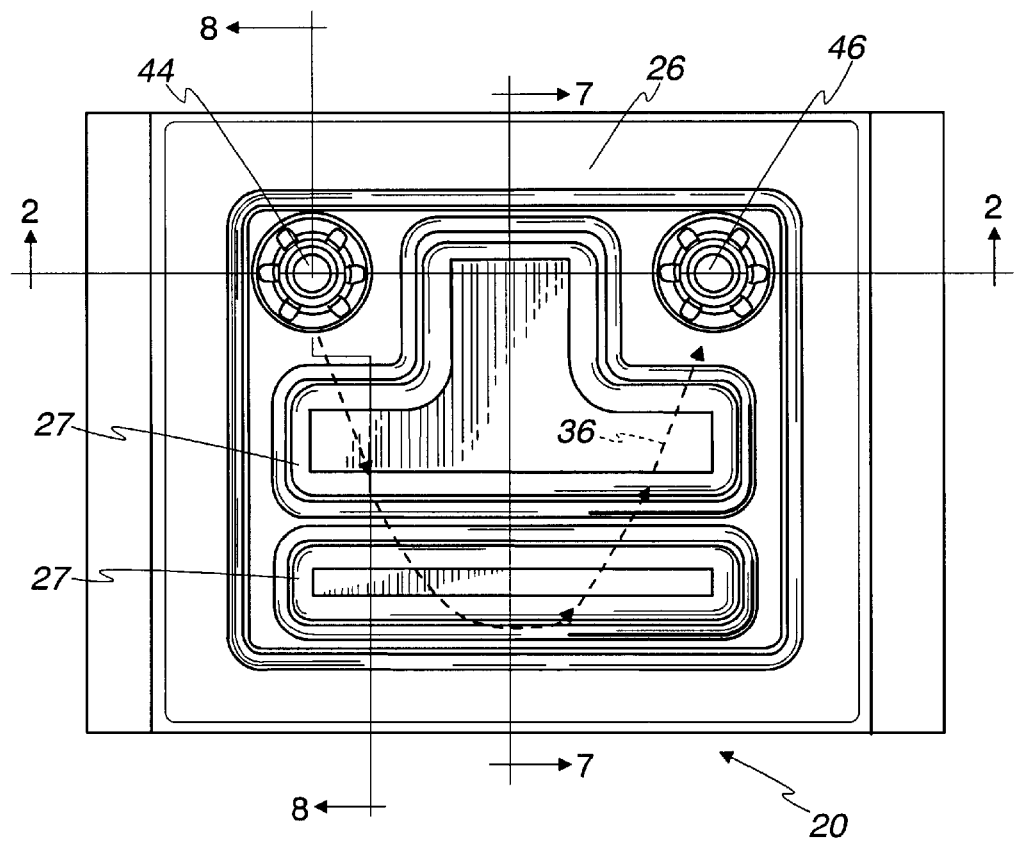
FIG. 1 is a top view of a heat exchanger incorporating the present invention in an apparatus for evaporative cooling.
Figure 2:
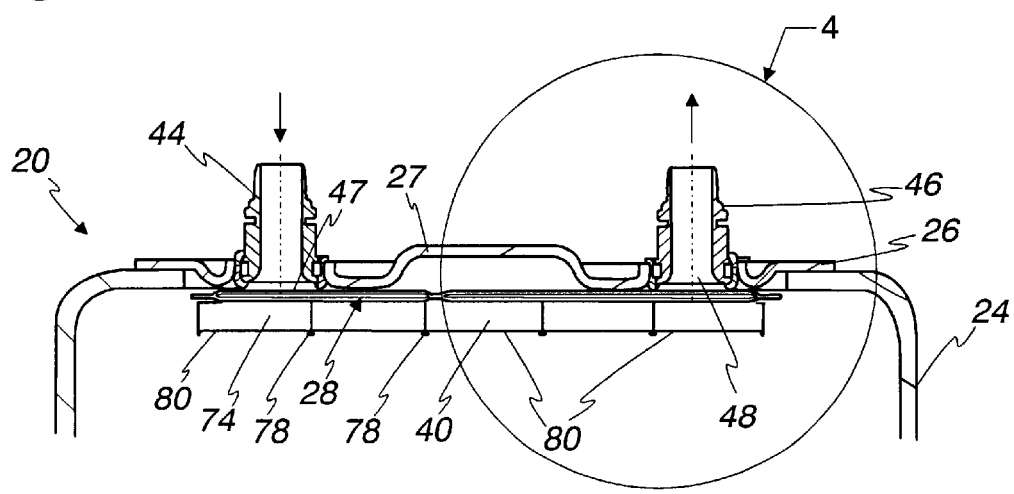
FIG. 2 is a cross-sectional view of a first embodiment of the invention taken along line D—D of FIG. 1.

FIGS. 1, 2 and 4 generally illustrate a first embodiment of the present invention, and in particular an evaporative heat exchanger 20 which forms the upper wall of a pressure-tight vessel 24, the upper portion of which is shown in FIG. 2.

In the illustrated embodiment of FIGS. 1, 2 and 4, a support plate 26 is suitably secured to the top of the vessel 24. Stiffening embossments 27 may be provided in the support plate 26. The support plate 26 may be manufactured, for example, by deep drawing (including, in the FIG. 3 embodiment described hereafter, a part of the vertical wall of vessel 24).

A coolant flow channel 28 is defined between two half shells 30, 32 joined together around their edge 33 (best seen in FIG. 4). A bead 34 may be provided between the half shells 30, 32 to separate the channel 28 into separate inlet and outlet channels 28a, 28b, with the bead running only part of the width of the shells 30, 32 (see particularly FIG. 6) whereby coolant will flow around the end of the bead 34 from the inlet channel 28a to the outlet channel 28b with flow thereby being in a substantially U-shaped path such as illustrated by the dashed line 36 in FIG. 1. An internal insert (not shown) may also be provided in the flow channel 28 (e.g., an insert such as used in oil coolers) in order to achieve an optimum high heat exchange rate at low pressure loss in the cooling liquid. It should be understood, however, that suitable coolant flow channels could be provided by other suitable structures, including a flat tube with its ends crimped together (after a suitable insert, if used, is placed therein) and still other structure including those illustrated in FIGS. 3 and 5.

Disposed beneath the coolant flow channel 28 is a fluted heat exchange element 40 as described in greater detail hereafter.

Suitable coolant liquid inlet and outlet connectors 44, 46 are also suitably secured to the support plate 26. For example, as illustrated particularly in FIG. 4, the support plate 26 may include two connector openings 47, 48, each with a collar 50 therearound suitable for accommodating an insert ring 52 suitable secured thereto (e.g., by soldering together aluminum sheets). The connector 44, 46 having a sealing ring 52 in a groove adjacent its bottom end is inserted into the insert ring 52, after which suitable brackets 54 may be bent at 53 over a shoulder in the connector 44, 46 to secure the connector 44, 46 to the support plate collar 50. As can also best be seen in FIG. 4, the upper half shell 32 (defining the upper surface of the coolant channel 28) also has a suitable opening 58 therein to allow coolant flow between the connector 44, 46 and the coolant channel 28.

Figure 6:
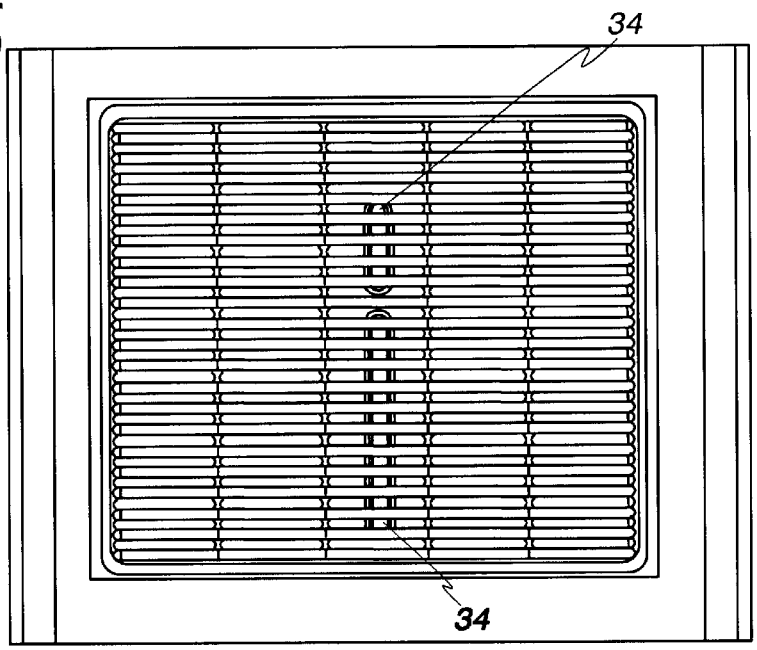
FIG. 6 is a bottom view of a heat exchanger incorporating the present invention.
Figure 8:
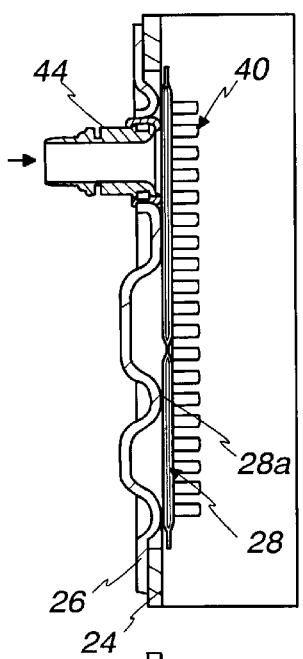
FIG. 8 is a cross-sectional view taken along line C—C of FIG. 1.
Figure 7:
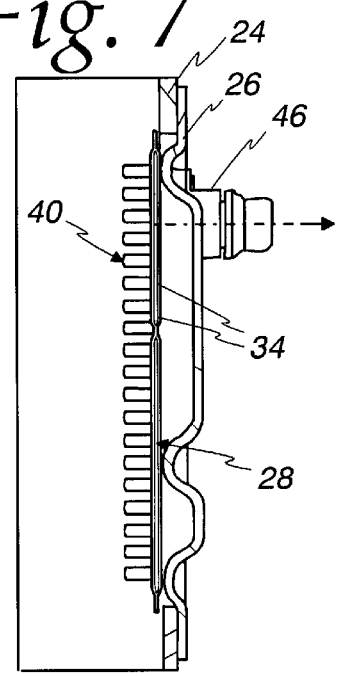
FIG. 7 is a cross-sectional view taken along line B—B of FIG. 1.
Figure 9:
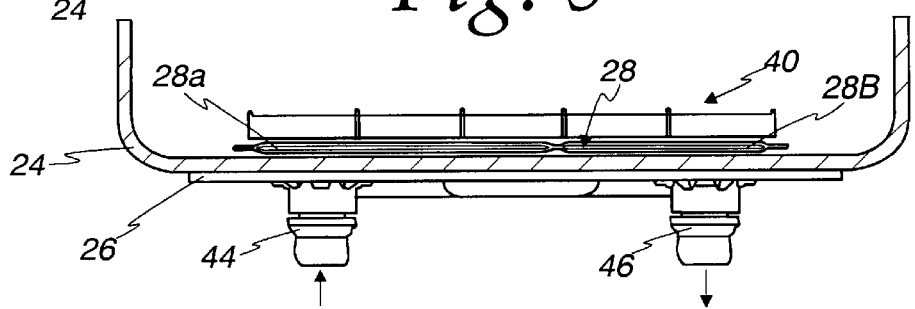
FIG. 9 is a side view of an inverted heat exchanger.

It will be appreciated that the above structure will allow coolant to flow into the inlet connector 44, then through the inlet channel 28a and outlet channel 28b (following the flow of dashed line 36) and then out the outlet connector 46. FIGS. 6–9 further illustrate this configuration (with FIG. 6 showing the U-shaped turn of direction at the top above where the bead 34 ends, FIG. 7 being a sectional view along the bead 34, FIG. 8 being a sectional view running parallel to the bead 34 and through the inlet channel 28a and inlet 44). Coolant for such purposes may be suitably provided depending upon the application. For example, when used with a starter/generator of a vehicle incorporated in the engine compartment, the employed coolant liquid may be the coolant liquid of the vehicle engine.

An alternate embodiment of the present invention is illustrated in FIGS. 3 and 5, wherein common components with the first described embodiment are identified by the same reference numerals as in FIGS. 1, 2 and 4, and where similar but modified components are identified by the same reference numerals with a prime added (e.g., support plate 26'). The FIGS. 3 and 5 embodiment differ from the FIGS. 1, 2 and 4 embodiment principally in the following respects: (1) the coolant channels 28' are defined between the lower half shell 30 and the support plate 26', with the separate inlet and outlet channels defined by a bead 34' connecting the lower half shell 30 and the support plate 36' (i.e., there is no separate upper half shell 32 as in FIGS. 1, 2 and 4); and (2) the support plate 26' is formed with integral downwardly depending walls 60' which may be joined with (and form together therewith) the side walls of the pressure-tight vessel 24'. Such variations are, however, independent of each other, and it would be within the scope of the present invention to provide a heat exchanger with both or only one of these variations. For example, the support plate may be selectively secured to a bent over top rim of the pressure-tight vessel (as shown in FIG. 2) or may be an integral portion of a top part of the vessel (as shown in FIG. 3) based upon which will provide a maximum heat exchange area across the top of the vessel relative to the vessel size for a given application (maximizing the heat exchange area will permit use of reduced size design for a given heat exchange rate).

In FIG. 3 in particular, the entire pressure-tight vessel 24' is shown in broken view in an example application (e.g., in an engine compartment) with the heat exchanger 20' disposed above an electronic component 64 (e.g., a starter/generator of a vehicle) surrounded by a bath of electrical insulating and evaporating liquid 66. As will be appreciated with a full understanding of the disclosed invention, the liquid 66 will evaporate due to heat from the electronic component 64, after which it will condense on the heat exchange element 40 (due to cooling from coolant in the coolant flow channel 28' of the heat exchanger 20'), with the condensed liquid 66 returned by gravity to the bath at the bottom of the vessel 24'.

FIGS. 10–16 illustrate various embodiments of suitable heat exchange elements 40 secured to the bottom of the coolant flow channels 28 (specifically, secured to the bottom of the lower half shell 30 in the illustrated embodiments) such as previously noted in FIGS. 1–9.

Specifically, the heat exchange element 40 may be a simple-to-manufacture fluted heat exchange element 40, such as may have otherwise been used in oil coolers, air charge coolers or similar heat exchangers, whereby the use of such prior elements may reduce costs.

Further, it has surprisingly been found that such prior fluted heat exchange elements 40 may be simply adapted to the requirements of use in evaporative cooling whereby it is possible to increase its heat exchange efficiency to the extent that it is quite comparable to the much more costly to manufacture heat exchange elements which have heretofore been used in evaporative cooling.

Specifically, the heat exchange element 40 may comprise a generally horizontally extending serpentine or fluted plate (see particularly FIGS. 10–11, where the element 40 is illustrated essentially upside down relative to its position during use) having upper crests 70 and lower crests 72 (or crests 70 and troughs 72) alternately connecting flanks 74. The flanks 74 extend longitudinally in a generally horizontal direction defining generally vertical surfaces when in use.

The heat exchange element 40 is secured to the flow channel 28 by suitable heat exchange connection of the upper crests 70 to the channel 28 (e.g., half shell 30). It will be appreciated that maximum heat conduction between the half shell 30 and heat exchange element 40 may be provide by maximizing the surface to surface contact therebetween. As such, the upper crests 70 may be substantially continuously between the upper edges of alternating flanks 74. Further, while the heat exchange element 40 is shown with its crests 70, 72 extending across the coolant flow path 28 (e.g., a single crest 70 extends under both the inlet and outlet connectors 44, 46), still other orientations would be within the scope of the present invention, including an orientation turned at right angles to the orientation shown. Further, the flanks of the fluted heat exchange element can have flutes themselves so that the fluted heat exchange element is designed fluted both in the X direction and Y direction (see FIG. 11), so that an even greater cooling surface is created.

In accordance with the present invention, the lower crests or troughs 72, by contrast, do not provide a continuous connection between lower edges of the flanks 74, but instead are formed with only minimal narrow connectors 78 therebetween such as is necessary to maintain the structural integrity of the heat exchange element 40 when handled during manufacturing. These connectors 78 may be formed in the heat exchange element 40 by suitably formed cutouts 80 (e.g., simple rectangles) in the element 40 between the spaced apart connectors 80, with the heat exchange element 40 suitably formed by bending a plate into a serpentine configuration where the connectors are disposed at the troughs 72 of the serpentine shape. The cutouts 80 may advantageously occupy a relatively large percentage of the total area of the lower crests 72 and the connectors 78 a relatively small percentage, whereby the space between the flanks 74 at the lower crests 72 is substantially open and unobstructed. However, suitable connectors 78 should advantageously be maintained in order to obtain favorable manufacturing capability of the heat exchange element 40, since the heat exchange elements 40 may be made from the relatively thin sheet strip in which the cutouts 80 are initially punched out and the serpentine or fluted shape then created.

Figure 15:
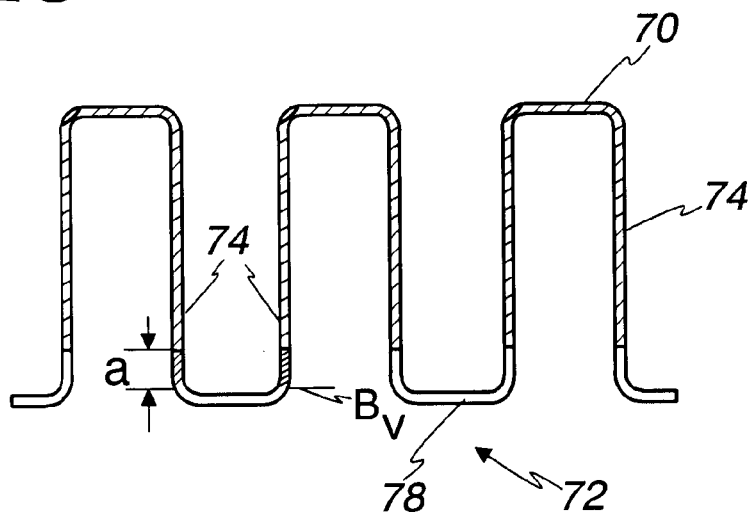
FIG. 15 is a cross-sectional view taken along line A—A of FIG. 14.
Figure 16:
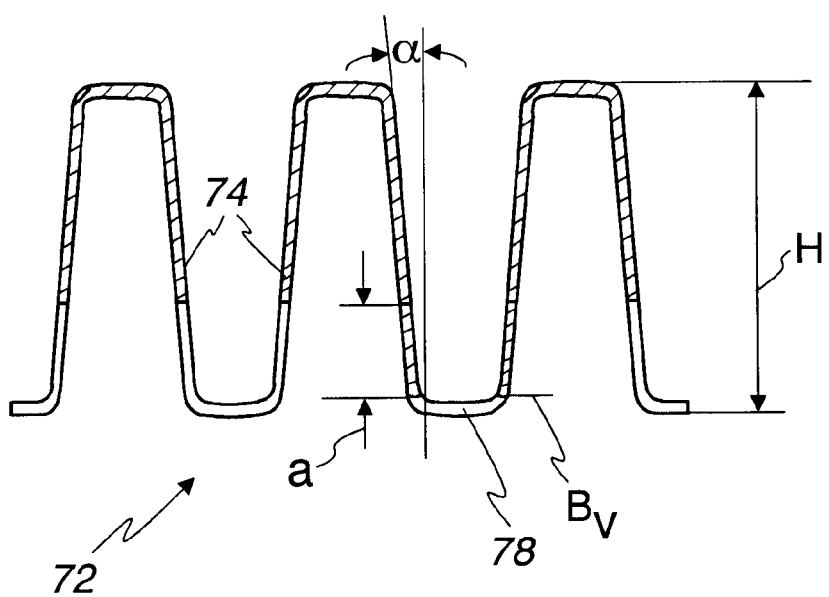
FIG. 16 is a cross-sectional view taken similar to FIG. 15 of an alternate embodiment of a heat exchange element.

In the heat exchange element 40' illustrated in FIGS. 10 and 16, a number of cutouts 80 are provided right next to each other and extend laterally relatively far into the flanks 74, as also shown in FIG. 16. However, the flanks 74 should be cut out, if structurally possible, no more than about one-fourth of height H (where height H is the spacing between the planes formed by the flute crests 70 and 72 as illustrated in FIG. 16). Further, in order to leave the surfaces formed by flanks 74 as large as possible, the sections of cutout 80 extending into flanks 74 may be configured wedge-like, as also shown in FIG. 10. Moreover, if structurally possible, cutouts 80 may also be advantageously provided only on the flute crests 72 (as illustrated in FIGS. 15 and 16 by the reference Bv on one of the flute crests 72), such structure increasing the heat exchange surface of flanks 74 relative to the element 40' illustrated in FIG. 10 by section a (as shown in FIGS. 15–16) and thereby maximizing the heat exchange surface of the flanks 74.

In the heat exchange element 40' illustrated in FIGS. 10 and 16, the flanks 74 are also slightly sloped toward each other. Advantageously, the flanks 74 should provide generally vertical surfaces, with this slope being less than 20° relative to the vertical. Of course, completely vertical surfaces can be provided such as illustrated in FIGS. 11 and 15.

FIG. 11 illustrates another heat exchange element 40", wherein each lower crest 72 includes only three narrow connectors 78 with two cutouts 80" therebetween.

The heat exchange element 40, which is fastened heat-conducting to the flow channel 12, may also be formed of several fluted heat exchange elements 40a, 40b, for example, as shown in FIGS. 12 and 13, with such elements 40a, 40b having their upper crests 72 suitably fastened in a heat-conducting manner to the flow channels 28 such as previously described. Such heat exchange elements 40a, 40b may be arranged so that the connectors 78 form rows. The heat exchange element 40c of FIG. 14 could similarly be viewed either as a single part which advantageously has a total of six connectors 78, or as a heat-exchange element 40c assembled from heat exchange elements 40a, 40b according to FIG. 12 or 13.

As illustrated in FIG. 15, the crests 70, 72 may be designed so as to be flat, or they may have a slight convex arch as in FIG. 16. Also, it should be understood that while the cutouts 80 have been illustrated in the Figs. as being arranged symmetrically to the summit of the flute crest 72, the cutouts could also be asymmetric within the scope of the present invention, where such cutouts are advantageously provided to cut out most of the surface percentage of the flute crest 72.

The advantageous operation of the heat exchanger 20 according to the present invention should now be understood. That is, by minimizing the blockage of the space between the flanks 74 at the lower troughs 72, evaporating cooling liquid may relatively freely pass up to the region of the flanks 74, which flanks provide cooling by their connection to the coolant flow path 28. Such cooling will cause condensation of the evaporated liquid, and the large open space between the flanks 74 will similarly allow such condensate to freely flow down the generally vertical surfaces of the flanks 74 to be then drawn by gravity back into the bath of liquid 66. Such continuous recirculation of the liquid inside the pressure-tight vessel 24 thus will provide advantageous heat exchange and cooling of the electronic component 64, with the free flow off of the flanks 74 particularly advantageously providing efficient heat exchange by minimizing condensate film on the flanks 74 which might otherwise hinder heat exchange between the evaporated liquid and the flanks 74.

Manufacture of a heat exchanger embodying the present invention may be suitably accomplished in any manner in which the above described advantageous configurations are obtained. As one example, the described parts may consist of a solder-coated aluminum sheet. After the support plate 26 is cut out and deformed by deep drawing as previously noted, the stiffening embossments 27 and two connector openings 47, 48 are provided for assembly with the coolant liquid inlet connector 44 and the cooling liquid outlet connector 46. These openings 47, 48 each have a collar 50 suitable for accommodating the insert ring 52 also made of aluminum sheet. As seen in FIGS. 2 and 4, the support plate 26 is then assembled with the two half shells 30, 32 forming the flow channel 28 (or only with one half-shell 18 as shown in FIGS. 3 and 5). Where two half shells 30, 32 are used (as depicted in FIGS. 2 and 4, the two half shells 30, 32 are joined together on the edge 33, and the upper half shell 32 must also have the openings 58 in order to permit inlet and outlet of the coolant liquid from the flow channel 28. Finally, the fluted heat exchange element 40 is mounted against the lower half shell 30 with its upper crests 70 arranged in a plane. This prefabricated unit can then be joined in the soldering furnace.

After soldering, the sealing rings 52 may be provided in the groove adjacent the bottom ends of the inlet connector 44 and the outlet connector 46, and the connectors 44, 46 then inserted into the already soldered-in insert ring 52 in order to sit tightly and firmly in the openings 47, 48 of the support plate 26, with the brackets 54 on the insert ring bent to secure the inlet and outlet connectors 44, 46 in their openings 47, 48. Specifically, the brackets 54 are bent down on one edge at 53 against the two connectors 44, 46 and force them firmly into openings 47, 48.

Further, keeping in mind that vessel 24 is a pressure vessel, the support plate 26 may be suitably connected to the wall of the vessel 24, for example, by welding (a welding seam 88 is illustrated in FIG. 3). In fact, it is within the scope of the present invention to manufacture the pressure vessel 24 in any suitable manner so as to obtain at least one of the advantages of the present invention, including forming the vessel 24 with a unitary base (bottom wall) and side walls, or with separate base and side walls firmly joined together. Of course, the base of the vessel 24 may be suitable formed to accommodate the structure of the electronic component 64 for which cooling is desired to be provided.

It should now be appreciated that the present invention provides a simply designed heat exchanger that can be favorably and inexpensively manufactured, which provides high efficiency during condensation of the evaporated liquid.

Still other aspects, objects, and advantages of the present invention can be obtained from a study of the specification, the drawings, and the appended claims. It should be understood, however, that the present invention could be used in alternate forms where less than all of the objects and advantages of the present invention and preferred embodiment as described above would be obtained.

What is claimed is:

1. A cooler for an electrical component, comprising:
   a pressure-tight vessel enclosing said electrical component and including a support plate above said electrical component;
   a bath of electrically insulating and evaporating liquid surrounding said electrical component within said vessel;
   a flow channel for coolant liquid on said support plate;
   a heat exchange element comprising a serpentine plate having generally horizontally extending and aligned flanks alternately connected along horizontally extending upper and lower edges, said lower edges being connected by connectors spaced along said horizontally extending edges and said upper edges being connected by horizontally extending crests secured to said flow channel for heat conduction therebetween.

2. The cooler of claim 1, further comprising a first shell secured beneath said support plate, said first shell defining a bottom surface of said flow channel.

3. The cooler of claim 2, further comprising a second shell between said support plate and said first shell, said second shell defining an upper surface of said flow channel.

4. The cooler of claim 1, wherein said heat exchange element crests are connected to said first shell in heat-conducting fashion.

5. The cooler of claim 1, wherein said flow channel defines a U-shaped path with two channel legs connected at one end, and further comprising a coolant liquid inlet connected to one of said channel legs and a coolant liquid outlet connected to the other of said channel legs.

6. The cooler of claim 1, wherein said support plate is the cover of said pressure-tight vessel.

7. The cooler of claim 1, wherein said vessel cover includes a surrounding downwardly extending flange forming part of the side walls of said pressure-tight vessel.

8. The cooler of claim 1, further comprising stiffening embossments on said support plate.

9. The cooler of claim 1, wherein said connectors connecting said lower edges of said flanks are defined between cutouts extending minimally into said flanks.

10. The cooler of claim 9, wherein said cutouts extend into said flanks no more than ¼ of the height H of said flanks.

11. The cooler of claim 1, wherein said connectors extend horizontally along said flanks substantially no longer than required to provide structural integrity to said heat exchange element when secured to said flow channel.

12. The cooler of claim 1, wherein said horizontally extending crests connecting said upper edges of said flanks extend substantially the entire length of said flanks.

13. The cooler of claim 1, wherein said flanks define surfaces sloped no more than about 20° from vertical.

14. An evaporative heat exchanger, comprising:
    a pressure-tight vessel enclosing a heat-generating component in a bath of surrounding evaporating liquid, said vessel including a support plate above said heat-generating component;
    a flow channel for coolant liquid on said support plate;
    a heat exchange element comprising a generally horizontally extending serpentine plate having crests and troughs alternately connecting flanks, said crests being secured to said flow channel for heat conduction therebetween and said troughs including spaced apart connectors between said flanks, said space between said connectors permitting evaporated evaporating liquid to pass.

15. The evaporative heat exchanger of claim 14, further comprising a first shell secured beneath said support plate, said first shell defining a bottom surface of said flow channel.

16. The evaporative heat exchanger of claim 15, further comprising a second shell between said support plate and said first shell, said second shell defining an upper surface of said flow channel.

17. The evaporative heat exchanger of claim 15, wherein said heat exchange element crests are connected to said first shell in heat-conducting fashion.

18. The evaporative heat exchanger of claim 14, wherein said flow channel defines a U-shaped path with two channel legs connected at one end, and further comprising a coolant liquid inlet connected to one of said channel legs and a coolant liquid outlet connected to the other of said channel legs.

19. The evaporative heat exchanger of claim 14, wherein said support plate is the cover of said pressure-tight vessel.

20. The evaporative heat exchanger of claim 14, wherein said vessel cover includes a surrounding downwardly extending flange forming part of the side walls of said pressure-tight vessel.

21. The evaporative heat exchanger of claim 14, wherein said heat exchange element is formed of a plate having cutouts therein and bent into a substantially serpentine shape with said flanks between said crests and said troughs, said cutouts being in said troughs.

22. The evaporative heat exchanger of claim 21, wherein said cutouts extend into said flanks no more than ¼ of the height H of said flanks.

23. The evaporative heat exchanger of claim 14, wherein said flanks define surfaces sloped no more than about 20° from vertical.

* * * * *